(12) United States Patent
Petersen

(10) Patent No.: US 7,310,240 B2
(45) Date of Patent: Dec. 18, 2007

(54) METHOD FOR INCREASING STABILITY OF SYSTEM MEMORY THROUGH ENHANCED QUALITY OF SUPPLY POWER

(75) Inventor: Ryan M. Petersen, Sunnyvale, CA (US)

(73) Assignee: OCZ Technology Group, Inc., Sunnyvale, CA (US)

( * ) Notice: Subject to any disclaimer, the term of this patent is extended or adjusted under 35 U.S.C. 154(b) by 265 days.

(21) Appl. No.: 10/907,420

(22) Filed: Mar. 31, 2005

(65) Prior Publication Data

US 2005/0226076 A1    Oct. 13, 2005

Related U.S. Application Data

(60) Provisional application No. 60/521,320, filed on Mar. 31, 2004.

(51) Int. Cl.
*H05K 7/00* (2006.01)

(52) U.S. Cl. ............... 361/782; 361/522; 361/523; 361/720; 361/748; 361/760; 361/761; 361/763; 361/785; 361/788; 361/791

(58) Field of Classification Search .............. 361/720, 361/748, 760, 761, 763, 785, 791, 782, 788, 361/522, 523, 509, 502, 500, 516, 624; 315/71
See application file for complete search history.

(56) References Cited

U.S. PATENT DOCUMENTS

| | | | | |
|---|---|---|---|---|
| 4,780,797 | A * | 10/1988 | Libby .................... | 361/509 |
| 5,369,547 | A * | 11/1994 | Evans .................... | 361/516 |
| 5,638,255 | A * | 6/1997 | Bobadilla et al. ........ | 361/624 |
| 5,962,979 | A * | 10/1999 | Dejonge ................. | 361/71 |
| 6,219,221 | B1 * | 4/2001 | Kibi et al. .............. | 361/502 |
| 6,510,041 | B1 * | 1/2003 | Imamura et al. ......... | 361/500 |
| 7,027,308 | B2 * | 4/2006 | Park et al. .............. | 361/782 |

* cited by examiner

*Primary Examiner*—Tuan T. Dinh
*Assistant Examiner*—Vicki L. Morgan
(74) *Attorney, Agent, or Firm*—Hartman & Hartman, P.C.; Gary M. Hartman; Domenica N. S. Hartman

(57) ABSTRACT

An apparatus for buffering power transients in a supply power for expansion cards inserted into expansion slots on a computer motherboard. The apparatus comprises a printed circuit board, a connector on the printed circuit board, and at least one capacitor on the printed circuit board. The connector is configured to fit into one of the expansion slots on the motherboard, and comprises at least one power pin and at least one ground pin. The at least one capacitor is connected to the power and ground pins of the connector and has sufficient capacitance to buffer power transients within the supply power to the expansion slots.

14 Claims, 3 Drawing Sheets

FIGURE 6
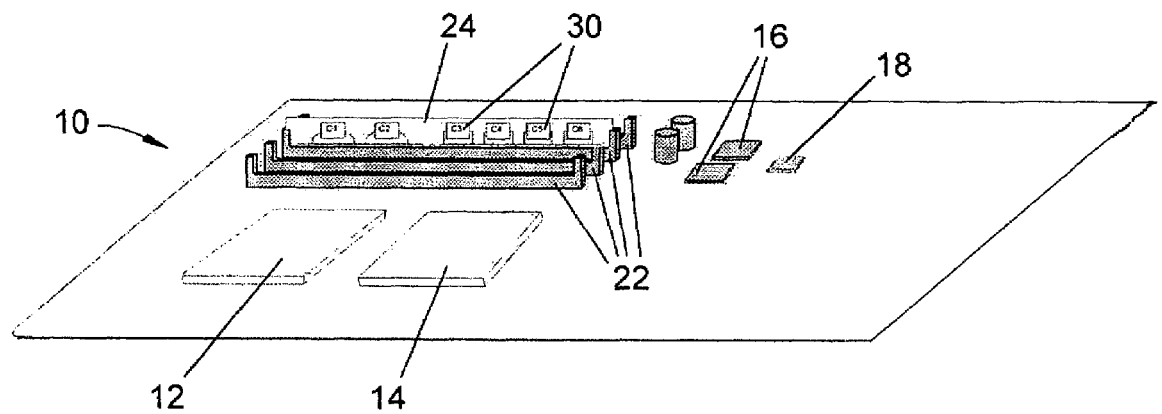
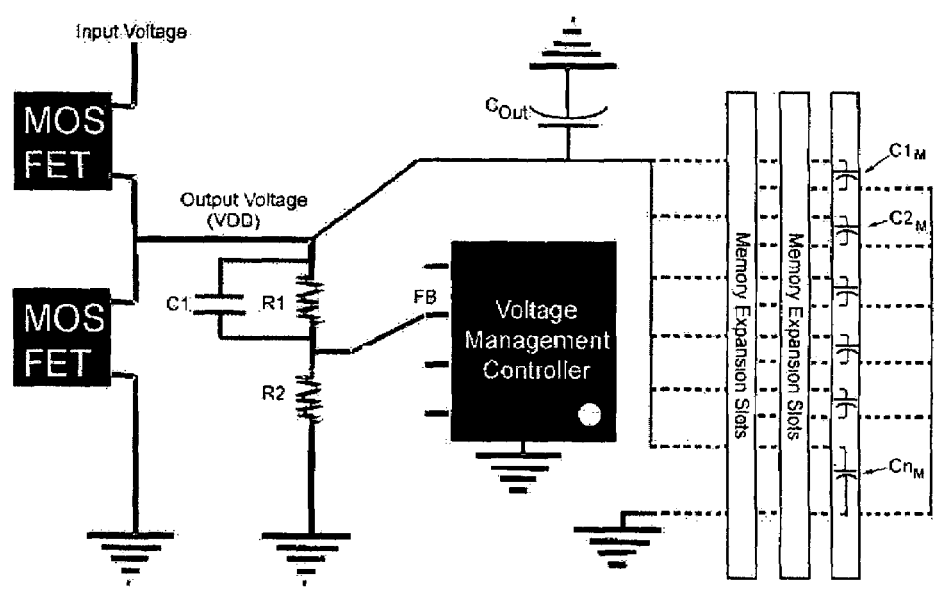
FIGURE 7

METHOD FOR INCREASING STABILITY OF SYSTEM MEMORY THROUGH ENHANCED QUALITY OF SUPPLY POWER

CROSS REFERENCE TO RELATED APPLICATIONS

This application claims the benefit of U.S. Provisional Application No. 60/521,320, filed Mar. 31, 2004.

BACKGROUND OF THE INVENTION

The present invention generally relates to increasing the system memory performance of a computer, and more particularly by enhancing the quality of the supply power fed to the system memory.

A trend in the computer industry has been the increase of the bus speed and all associated devices, primarily the interface between the main processor and the chipset including memory controller as well as the interface between the memory controller and the memory devices known as the memory bus. The memory devices are running at memory bus speed.

Aside from obvious speed issues that the memory devices can be subjected to, another concern relates to power draw of the individual devices as well as their aggregates in the form of memory modules. The power draw is proportional to the operating frequency, meaning that at lower operating frequencies, the devices will draw less power than at higher frequency. In addition to the raw issue of power draw, a major concern is the switching frequency of the devices, that is, how fast the transition from, e.g., a low power state in the form of active standby or even open page state to a four bank interleaved read occurs. The rapid switching between the different power states requires equally rapid switching capabilities of the power supply units as well as buffering capabilities of the entire voltage regulation module (VRM). The demand on the VRM increases with either overclocking or else increased system memory density, that is, more memory that needs to be powered. In this case, the state change of each module within the system can lead to interactions on the level of power supply between different modules, that can result in voltage peaks and valleys, either of which can adversely affect the operability and stability of all memory devices within the system.

Contemporary mainboard (motherboard) technology is using fast switching power management controllers that are supplemented by onboard capacitors for buffering of fast positive or negative voltage transients. Since the requirements for the circuitry lack detailed specifications it is up to the mainboard manufacturers to provide a solution deemed sufficient for delivering adequate supply and termination voltages. In most cases, the embodiment of choice is a single phase solution at minimum manufacturing cost. Despite the use of capacitors, this arrangement is not sufficient to provide optimal supply current to the memory devices, especially under load switching conditions.

BRIEF SUMMARY OF THE INVENTION

The present invention provides an apparatus for buffering power transients in a supply power for expansion cards inserted into expansion slots on a computer motherboard. The apparatus comprises a printed circuit board, a connector on the printed circuit board, and at least one capacitor on the printed circuit board. The connector is configured to fit into one of the expansion slots on the motherboard, and comprises at least one power pin and at least one ground pin. The at least one capacitor is connected to the power and ground pins of the connector and has sufficient capacitance to buffer power transients within the supply power to the expansion slots.

In view of the above, it can be seen that a significant advantage of this invention is that an apparatus is provided capable of buffering voltage transients, that is, overshoots as well as undershoots, within the memory power subsystem by means of capacitors coupled to the subsystem through an expansion slot. As such, another advantage of the invention is the ability and ease of upgrading existing systems having an empty expansion slot.

Other objects and advantages of this invention will be better appreciated from the following detailed description.

BRIEF DESCRIPTION OF THE DRAWINGS

FIG. 6 schematically represents the motherboard of FIG. 2 with a capacitor module of this invention inserted in a memory expansion slot on the motherboard.

FIG. 7 is an electrical schematic of FIG. 6 and shows how the capacitor module in the third memory expansion slot interacts through the shared power and ground traces with the entire memory VRM.

DETAILED DESCRIPTION OF THE INVENTION

The present invention makes possible enhancements in the quality of the system memory power supply on a computer motherboard by utilizing empty expansion slots, such as empty memory slots, present on the motherboard. As evident from FIG. 1, which is an electrical schematic of a memory VRM of a type known in the art, the power and ground circuitry for all memory slots on a conventional motherboard is unified. Such an arrangement offers the possibility of using a power supplement that conforms to the form factor used in the memory devices in any empty memory interface, since it will interact with the remaining power circuitry in the same fashion as a memory device.

Figure 1:
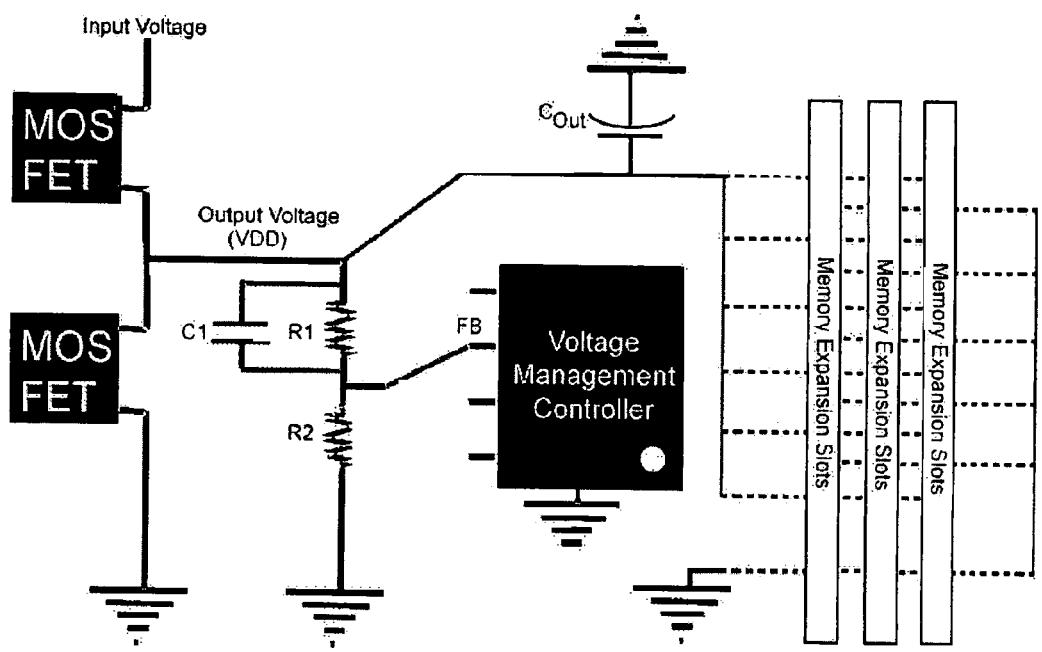
FIG. 1 is an electrical schematic of a memory VRM of a type known in the art.
Figure 2:
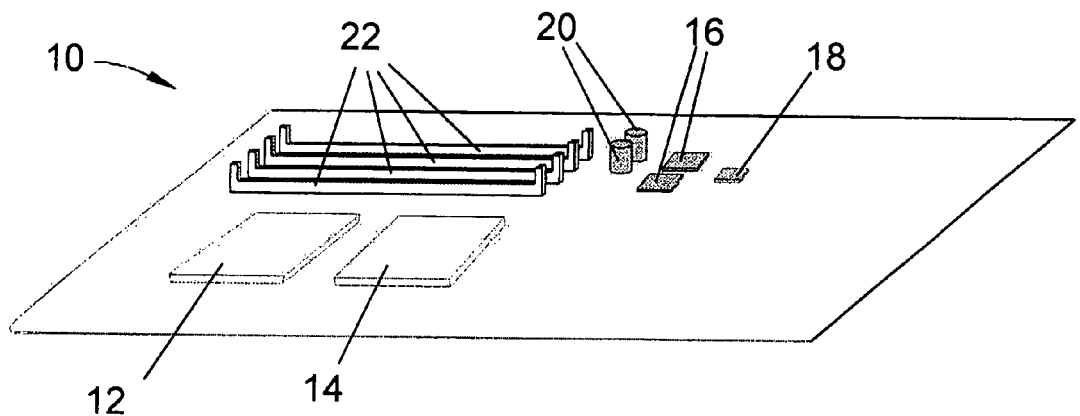
FIG. 2 schematically represents a typical configuration for a memory VRM on a motherboard.

FIG. 2 schematically represents a typical configuration for a memory VRM on a computer motherboard 10 with four empty memory expansion slots 22. For reference, FIG. 2 also shows a central processor 12 and chipset 14 on the motherboard 10. The expansion slots 22 are conventionally powered through MOSFET's 16 that are regulated by a memory controller 18, as is well known in the art. Ripple currents and spikes are buffered to some extent by onboard capacitors 20 conventionally mounted to the motherboard 10. As represented in FIG. 1, the controller 18 uses a feedback loop from the output voltage to regulate the MOSFET's 16, which receive input voltage and are connected to ground. Two resistors (R1 and R2) are shown in FIG. 1 as being used in The feedback loop to generate a reference voltage for the controller 18. The two capacitors 20 in FIG. 2 are identified as $C_{out}$ and $C_1$ in FIG. 1.

Figure 3:
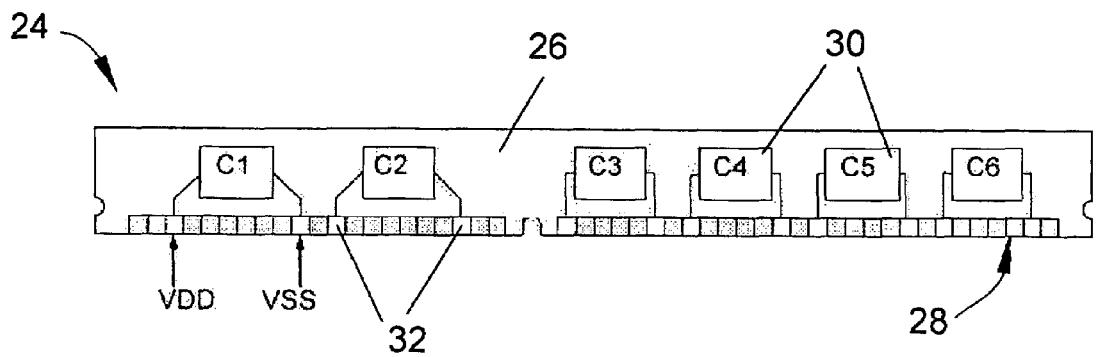
FIG. 3 represents a capacitor module in accordance with one embodiment of the present invention.
Figure 4:
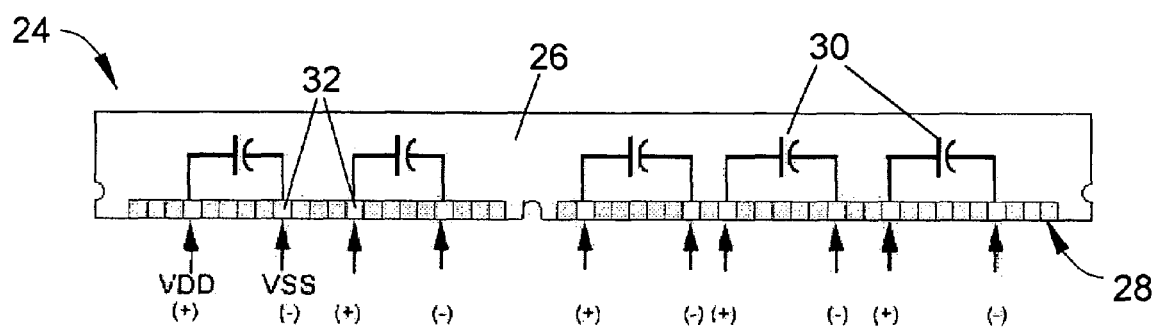
FIG. 4 is an electrical schematic of the capacitor module of FIG. 3, representing capacitors between the power and ground pins of the module.

FIG. 3 represents a module 24 suitable for insertion into one of the memory slots 22 of the motherboard 10 of FIG. 2 for the purpose of enhancing the system memory power supply in accordance with a preferred aspect of this invention. As with a conventional memory module, the module 24 is in the form of a printed circuit board 26 with a connector 28 along one of its edges. However, instead of featuring actual memory devices connected to power and ground pins 32 of the connector 28, the module 24 is shown as being equipped with multiple capacitors 30 for the purpose of buffering voltage transients within the power subsystem supplying the memory on the motherboard 10. As such, the module 24 can be referred to as a capacitor module. Each capacitor 30 is shown connected to a single pair of VDD (power/+) and VSS (ground/−) pins 32 of the connector 28. All other pins on the connector 28 are no-connects. FIG. 4 is an electrical schematic of the capacitor module 24 of FIG. 3.

The capacitors 30 can be of any suitable type, such as electrolytic or tantalum capacitors 30. Furthermore, the multiple capacitors 30 of the module 24 may have different capacitances. In particular, capacitors with lower capacitance are able to charge and discharge faster than capacitors with higher capacitance, which are therefore more inert. As an example, a combination of capacitors with capacitance values of about 100 μF and about 1000 μF should have the advantage of buffering relatively large fluctuations as well as reacting to relatively smaller, faster transients.

FIG. 6 schematically represents the motherboard 10 of FIG. 2 with the capacitor module 24 of FIGS. 3 and 4 installed in the third of four memory expansion slots 22 on the motherboard 10. FIG. 7 is an electrical schematic of FIG. 6 and evidences the manner in which the capacitor module 24 in the third memory expansion slot 22 is able to advantageously interact through the shared power and ground traces of the memory bus with the entire memory VRM.

As evident from FIGS. 6 and 7, a notable advantage of using the module 24 of this invention to buffer voltage transients in the memory power subsystem of a motherboard is the proximity of the memory interfaces to each other in most commercially available systems. That is, for reasons of signal integrity and trace length matching, most memory slots (e.g., 22 in FIGS. 2 and 6) are placed very close to each other, and usually closer to each other than to the memory voltage regulator module. This, in turn, warrants the fastest possible interaction of any auxiliary power structures with any other memory device present in the system and sharing the same power and ground planes.

Figure 5:
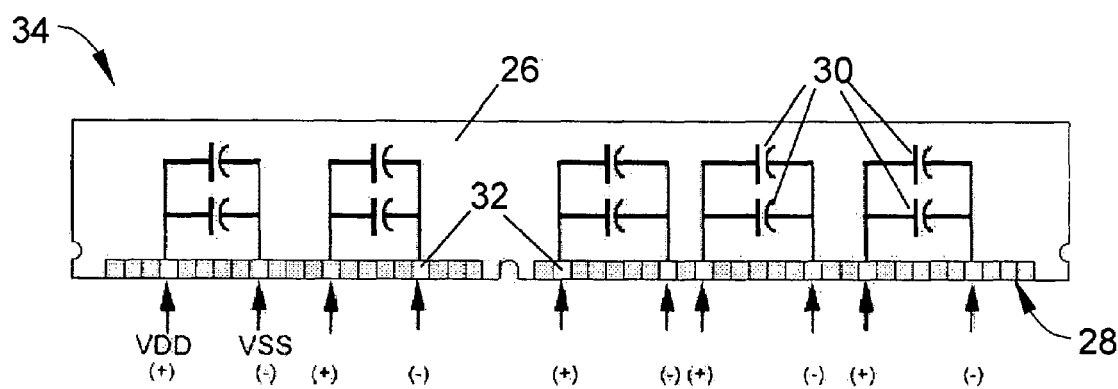
FIG. 5 is an electrical schematic of a capacitor module with two capacitors in parallel between each power and ground pin in accordance with another embodiment of the present invention.

FIG. 5 is an electrical schematic of another capacitor module 34 within the scope of this invention. The module 34 differs from the module 24 of FIGS. 3 and 4 as a result of being equipped with two capacitors 30 in parallel between pairs of power and ground pins 32. This particular embodiment allows the use of physically smaller capacitors, which is advantageous in terms of space constraints (especially in server environments), while maintaining a high buffering capacitance. Alternatively or in addition, the embodiment of FIG. 5 is also useful in situations where capacitors with different capacitance values are to be used in combination, as described above.

While the invention has been described in terms of a preferred embodiment, it is apparent that other forms could be adopted by one skilled in the art. For example, the physical configuration of the modules 24 and 34 could differ from that shown, as well as a motherboard equipped with the modules. Therefore, the scope of the invention is to be limited only by the following claims.

What is claimed is:

1. An apparatus for buffering power transients in a supply power for expansion cards inserted into expansion slots on a computer motherboard, the apparatus comprising:
   a printed circuit board;
   a connector on the printed circuit board, the connector being configured to fit into a first expansion slot of the expansion slots on the motherboard, the connector having multiple pins comprising at least one power pin and at least one ground pin that define at least a first pair of power and ground pins, the connector being configured so that the power pin of the first pair of power and ground pins is connected to the supply power when the connector is received in the first expansion slot; and
   at least one capacitor mounted to the printed circuit board and electrically connected to the first pair of power and ground pins of the connector, the at least one capacitor having a capacitance sufficient to buffer power transients within the supply power supplied to the expansion slots.

2. The apparatus according to claim 1, wherein the first expansion slot for which the connector is configured is a memory expansion slot of the motherboard.

3. The apparatus according to claim 2, wherein the at least one capacitor is an electrolytic capacitor.

4. The apparatus according to claim 2, wherein the at least one capacitor is a tantalum capacitor.

5. The apparatus according to claim 1, wherein the at least one capacitor is one of a plurality of capacitors on the printed circuit board and the first pair of power and ground pins is one of a plurality of pairs of power and ground pins defined by the multiple pins of the connector, each of the capacitors being electrically connected to a pair of the plurality of pairs of power and ground pins.

6. The apparatus according to claim 1, wherein multiple capacitors are electrically connected to the first pair of cower and ground pins.

7. The apparatus according to claim 6, wherein at least two of the multiple capacitors have different capacitances and cooperate to buffer relatively larger transients and relatively smaller faster transients.

8. An apparatus comprising:
   a motherboard comprising expansion slots to which supply power is supplied by a bus on the motherboard;
   expansion cards inserted into at least some of the expansion slots and powered by the bus through the expansion slots;
   a printed circuit board inserted into at least a first expansion slot of the expansion slots, the printed circuit board having a connector engaged with the first expansion slot, the connector having multiple pins comprising at least one power pin and at least one ground pin that define at least a first pair of power and ground pins, the power pin of the first pair of power and ground pins being connected to the supply power; and
   at least one capacitor mounted to the printed circuit board and electrically connected to the first pair of power and ground pins of the connector, the at least one capacitor having a capacitance sufficient to buffer power transients within the supply power supplied to the expansion slots.

9. The apparatus according to claim 8, wherein the first expansion slot into which the connector is inserted is a memory expansion slot.

10. The apparatus according to claim 9, wherein the at least one capacitor is an electrolytic capacitor.

11. The apparatus according to claim 9, wherein the at least one capacitor is a tantalum capacitor.

12. The apparatus according to claim 8, wherein the at least one capacitor is one of a plurality of capacitors on the printed circuit board and the first pair of power and ground pins is one of a plurality of pairs of power and ground pins defined by the multiple pins of the connector, each of the capacitors being electrically connected to a pair of the plurality of pairs of power and ground pins.

13. The apparatus according to claim 8, wherein multiple capacitors are electrically connected to the first pair of power and ground pins.

14. The apparatus according to claim 13, wherein at least two of the multiple capacitors have different capacitances and cooperate to buffer relatively larger transients and relatively smaller faster transients.

* * * * *